US008331412B2

(12) United States Patent
Amann et al.

(10) Patent No.: US 8,331,412 B2
(45) Date of Patent: Dec. 11, 2012

(54) VERTICAL-CAVITY SURFACE-EMITTING SEMICONDUCTOR LASER DIODE AND METHOD FOR THE MANUFACTURE THEREOF

(75) Inventors: Markus-Christian Amann, Munich (DE); Markus Ortsiefer, Garching (DE)

(73) Assignee: Vertilas GmbH, Garching (DE)

( * ) Notice: Subject to any disclaimer, the term of this patent is extended or adjusted under 35 U.S.C. 154(b) by 0 days.

(21) Appl. No.: 12/623,247

(22) Filed: Nov. 20, 2009

(65) Prior Publication Data

US 2010/0128749 A1 May 27, 2010

(30) Foreign Application Priority Data

Nov. 21, 2008 (DE) .......................... 10 2008 058 402
Mar. 12, 2009 (DE) .......................... 10 2009 001 505

(51) Int. Cl.
*H01S 5/00* (2006.01)
(52) U.S. Cl. ................. 372/50.11; 372/50.124; 372/102
(58) Field of Classification Search ............... 372/50.11, 372/50.124, 102
See application file for complete search history.

(56) References Cited

U.S. PATENT DOCUMENTS

| 6,282,219 | B1 * | 8/2001 | Butler et al. | ............... | 372/50.1 |
| 2005/0135453 | A1 * | 6/2005 | Kneissl et al. | ............ | 372/94 |
| 2007/0242715 | A1 | 10/2007 | Gustavsson | | |
| 2007/0258501 | A1 * | 11/2007 | Chirovsky | ............... | 372/50.11 |
| 2008/0298419 | A1 * | 12/2008 | Hori et al. | ............... | 372/50.124 |
| 2009/0034572 | A1 * | 2/2009 | Ikuta | ..................... | 372/46.013 |

FOREIGN PATENT DOCUMENTS

| EP | 0798574 A2 | 10/1997 |
| GB | 2428887 A | 2/2007 |
| JP | 2005039102 A | 2/2005 |

OTHER PUBLICATIONS

D. Lu, J. Ahn, D.G. Deppe, All Epitaxial Current and Mode Confined AlGaAS/GAAs VCSEL, Electronic Letters, Oct. 14, 2004, vol. 40, No. 21, 2 pages.
Michael C. Riedl & Thomas Knodl, Apparaches for Polarization Control in VCSELs, www.uni-ulm.de, Annual Report 2000, Optoelectronics Department, University of Ulm, p. 21-26.
Stephen Y. Chou & Wenyog Deng, Subwavelength Amorphous Silicon Transmission Gratings & Applications in Polarizer and Waveplates, Appl. Phys. Lett. 67(6), Aug. 7, 1995, pp. 742-744.
European Search Report issued in related European Patent Application 09175845.8 dated Mar. 17, 2011 with translation, 12 pages.
Response to European Search Report with Partial Translation of Response and full translation of claims as filed dated Aug. 16, 2011, 23 pages.

* cited by examiner

*Primary Examiner* — Yuanda Zhang
(74) *Attorney, Agent, or Firm* — Lathrop & Gage LLP

(57) ABSTRACT

The present invention includes a vertical-cavity surface-emitting semiconductor laser diode having a resonator with a first distributed Bragg reflector, an active zone which has a p-n junction and is embedded into a semiconductor layer sequence, and a second distributed Bragg reflector. The semiconductor laser diode has an emission wavelength $\lambda$, wherein a periodic structure is arranged within the resonator as an optical grating made of semiconductive material and dielectric material, the main plane of extension of which is arranged substantially perpendicularly to the direction of emission of the semiconductor laser diode. The periodic structure is in direct contact with at least one of the semiconductor layers embedding the active zone and with at least one of the two distributed Bragg reflectors.

25 Claims, 4 Drawing Sheets

VERTICAL-CAVITY SURFACE-EMITTING SEMICONDUCTOR LASER DIODE AND METHOD FOR THE MANUFACTURE THEREOF

CROSS-REFERENCE TO RELATED APPLICATIONS

This application claims priority to commonly-owned and copending German Patent Application No. 10 2008 058 402.9, filed 21 Nov. 2008, and German Patent Application No. 10 2009 001 505.1, filed 12 Mar. 2009. The above-referenced applications are incorporated herein by reference in their entireties.

FIELD OF THE INVENTION

The present invention relates to a vertical-cavity surface-emitting semiconductor laser diode and to a method for manufacturing a vertical-cavity surface-emitting semiconductor laser diode of this type.

BACKGROUND

Vertical-cavity surface-emitting lasers (VCSELs) are semiconductor lasers in which light emission occurs perpendicularly to the surface of the semiconductor chip. Vertical-cavity surface-emitting laser diodes have a plurality of advantages over conventional edge-emitting laser diodes, such as low electrical power consumption, the possibility of directly inspecting the laser diode on the wafer, simple possibilities for coupling to a fibre optic, longitudinal single-mode spectra and the possibility of connecting the surface-emitting laser diodes to a two-dimensional matrix.

Typical vertical-cavity surface-emitting semiconductor laser diodes having an emission wavelength $\lambda$ (=vacuum wavelength) have a resonator comprising at least a first distributed Bragg reflector (DBR), an active zone having a p-n junction and a second distributed Bragg reflector. Laser diodes of this type generally possess a cylindrically symmetrical structure and have, owing to their design and also the methods for the manufacture thereof, no preferred direction of polarisation of the emitted wave. There are therefore two orthogonal states with regard to the direction of polarisation of the emitted wave. In an ideal laser structure, these two states are energetically degenerate and on an equal footing for the laser operation. However, owing to the electrooptic effect, to anisotropies in the component design and to asymmetries and fluctuations in the manufacturing process, this degeneration is cancelled and the VCSEL oscillates predominantly in one polarisation mode. In most cases, the mechanism leading to a VCSEL favoring a specific mode is difficult to monitor or not obvious, resulting overall in a statistical character of the polarisation behaviour. Polarisation jumps generally limit use in polarisation-dependent optical systems. For example, jumps of this type in optical data transmission lead to increased noise. As many applications are dependent on polarisation-stable lasers as light sources, this means a significant reduction in the production yield. Although a preferred direction can be defined in some cases, cancellation of degeneration is not sufficiently strong to ensure polarisation stability under variable environmental and operating conditions. In this case, even minor alterations of these parameters can cause a change-over between the two states (pole flip).

In the past, various possibilities were studied for stabilising polarisation. In order to achieve polarisation stability of GaAs-based VCSELs, growth was successfully demonstrated on higher-indexed [311] substrates, cf. in this regard "An 850-nm InAlGaAs Strained Quantum-Well Vertical-Cavity Surface-Emitting Laser Grown on GaAs (311)B Substrate with High-Polarization Stability," IEEE Photon. Technol. Lett., 12, 942 (2000). However, as the remaining laser properties are generally impaired and difficult growth conditions exist, in particular for InP-based semiconductor layers, this method would not appear suitable for long-wave VCSELs.

Another approach includes applying dielectric or metallic grating structures with periods in the wavelength range to the output mirror. This is described for example in the publication "Polarisation stabilisation of vertical-cavity top-surface-emitting lasers by inscription of fine metal-interlaced gratings," Appl. Phys. Lett. 66, 2769 (1995) or DE 103 53 951 A1. Dielectric gratings used lead to interference effects, as a result of which total reflection is strengthened or weakened by the grating in a polarisation-dependent manner. A period of the corresponding grating structures must therefore be more than half a vacuum wavelength.

In addition, it is also known to apply metal/dielectric or metal/semiconductor structures with periods smaller than a wavelength of a VCSEL to one of two distributed Bragg reflectors in order to generate polarisation by birefringence. This is disclosed for example in the publication "Polarization control of vertical-cavity surface-emitting lasers using a birefringent metal/dielectric polarizer loaded on top distributed Bragg Reflector," IEEE J. Sel. Top. Quantum. Electron. 1, 667 (1995) or JP 80 56 049 (A). In this solution, metallic-dielectric gratings are intended to serve to generate birefringence in the laser resonator. Thus, an optical resonator length or a resonance frequency of the laser resonator is intended to correspond to a reflectivity maximum of the Bragg mirror or mirrors only in one polarisation. The other polarisation is to be suppressed. However, the described experimental results show that an achievable polarisation orientation is not sufficient.

Whereas the above-described embodiments have a periodic structure for controlling polarisation outside an inner resonator region (the latter corresponds to the region between the two DBRs), JP 2005 039102 A describes a construction in which a periodic grating is located between the two DBRs. This structure consists, on the other hand, of two separate and independent components, the periodic grating not being in direct contact with one of the two DBRs. Problems that are typical in the manufacture of one-piece or monolithic diodes, such as for example diffusion, therefore do not occur in this configuration.

A further embodiment of a periodic grating is described in US 2003/0048827 A1. In this case, use is made of a monolithic construction in which a grating is epitaxially integrated into one of the two semiconductor distributed Bragg reflectors. The alternating layer system is based in this case primarily on a different doping. However, only comparatively small differences in index of refraction can be generated in this way, as a result of which the polarisation mode is not sufficiently split.

SUMMARY

A vertical-cavity surface-emitting semiconductor laser diode has a resonator with a first distributed Bragg reflector, an active zone which has a p-n junction and is embedded into a sequence of semiconductor layers, and a second distributed Bragg reflector. The laser diode has an emission wavelength $\lambda$, and is characterised by a periodic structure arranged within the resonator as an optical grating made of semiconductive material and dielectric material. A main plane of extension of the periodic structure is substantially perpendicular to a direction of emission of the laser diode. The periodic structure is in direct contact with at least one of the semiconductor layers embedding the active zone, and with at least one of the two distributed Bragg reflectors.

A method for manufacturing a semiconductor laser diode includes applying a resonator including at least a first distributed Bragg reflector, an active zone that has a p-n junction and is embedded into a sequence of semiconductor layers, and a second distributed Bragg reflector, to a substrate. The method further includes applying a periodic structure including semiconductive and dielectric materials, the main plane of extension of the periodic structure being substantially perpendicular to a direction of emission of the semiconductor laser diode, within the resonator. The periodic structure is in direct contact with at least one of the semiconductor layers and with at least one of the two distributed Bragg reflectors.

DETAILED DESCRIPTION OF DRAWINGS

Figure 1:
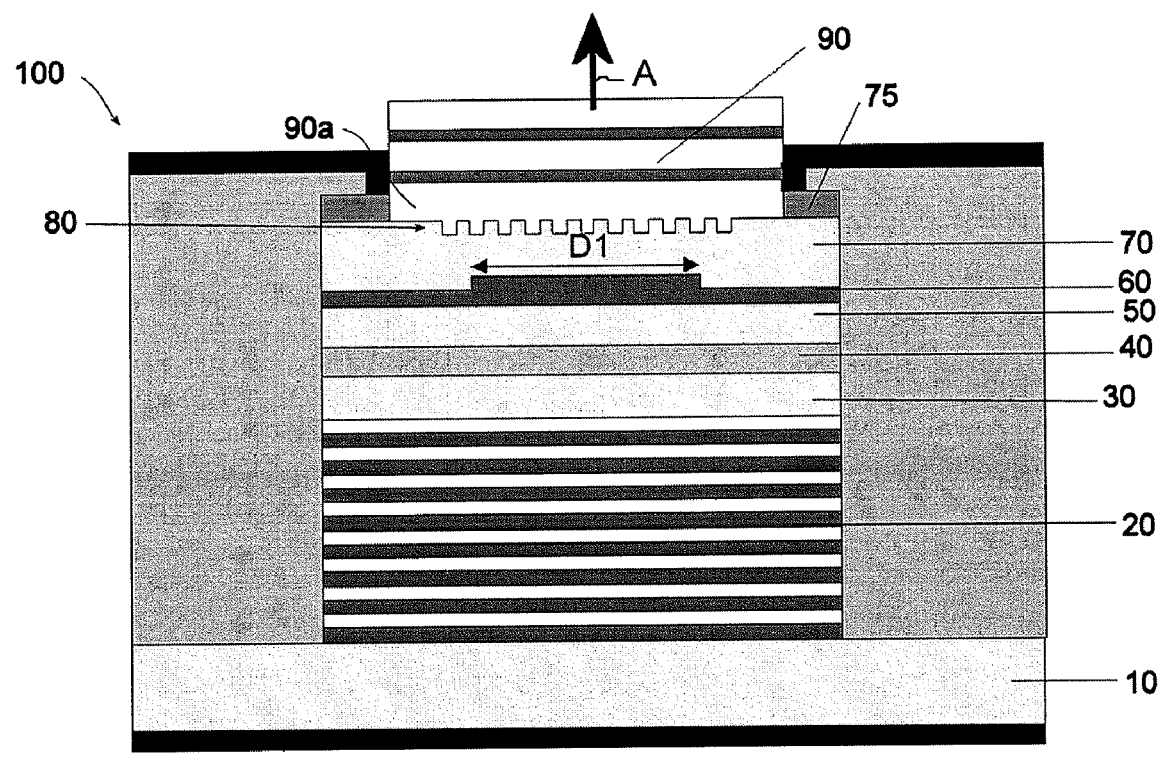
FIG. 1 shows schematically the layer construction of a first preferred embodiment of a laser diode, according to an embodiment.

It is desired to improve the polarisation orientation and polarisation stability in surface-emitting semiconductor laser diodes. The present invention is directed to a vertical-cavity surface-emitting semiconductor laser diode and a method for the manufacture thereof. Advantageous embodiments are set forth in the following description.

The present invention presents a polarisation-stable VCSEL. The invention includes in this case, in particular, the integration of a periodic structure having a defined orientation, geometry and a defined index of refraction profile within a monolithic VCSEL resonator, for example in the form of a subwavelength grating (SWG). The structure allows deterministic and stable polarisation behaviour with high polarisation mode-side mode suppression and also insensitivity to feedback. In addition, the laser diode according to the invention favors the lateral basic mode even in the case of relatively large apertures, allowing overall higher single-mode powers to be achieved than in conventional VCSELs.

In the known solutions, which use a grating or a periodic structure for polarisation, the grating structure is externally attached to the output mirror, as a result of which the achievable quality of the reflection and polarisation properties is limited.

The invention recognises that a periodic structure made of semiconductive material, on the one hand, and dielectric material, on the other hand, is suitable to be arranged within the resonator. The structure has a sufficiently high index of refraction contrast to define a preferred polarisation direction by means of birefringence.

Advantageously, the period of the periodic structure is at most one, preferably at most half an emission wavelength $\lambda$. It is thus possible to suppress interference effects which are undesirable in the present application. Herein, the term "emission wavelength" refers in all cases to the vacuum wavelength.

According to a preferred embodiment, the period of the structure is at most $\lambda/n$, preferably at most $\lambda/2n$, n being a function of the index of refraction of the semiconductive material and/or the index of refraction of the dielectric material. For example, n corresponds to what is known as an effective index of refraction which is calculated in particular as a, preferably arithmetically weighted, average value of the two indices of refraction. It is also preferred if n corresponds to the higher of the two indices of refraction. In a configuration of this type, polarisation-dependent averaging of the index of refraction is particularly pronounced. At an emission wavelength of 1,310 nm and a (higher) index of refraction of, for example, n=3.2 for InP as the semiconductor, this produces a period length of at most ~400 nm. In the case of a diffraction grating-type structure (i.e. a grating made up of equally spaced longitudinal structures), a ratio of the web width and pit width may be 1:1 or have values differing therefrom. In the foregoing example, the web width and pit width could each be 200 nm. The shorter the period length is, the better the polarisation stability is expected to be.

In contrast to the grating structures described in the prior art, much smaller periods in the subwavelength range are thus preferably used (typically smaller than half the emission wavelength), as what matters is the generation of a polarisation-dependent effective index of refraction, and not a polarisation-dependent increase of mirror reflectivity with larger-periodic gratings.

According to a preferred configuration, the periodic structure directly adjoins the second distributed Bragg reflector. The present configuration thus teaches in particular generating an effective birefringence by arranging a semiconductor/dielectric structure within the resonator, the structure being placed in front of a metallic, dielectric or hybrid metallic-dielectric mirror.

Preferably, a dielectric material of the periodic structure is the same as the material of an adjoining layer of the second distributed Bragg reflector. Simple manufacture is in this way possible, a mask first being defined, preferably on a semiconductor layer which is intended to form the semiconductive component of the periodic structure. This is carried out using relevant nanostructuring techniques such as electron beam lithography, nanoimprinting, holography, etc. Subsequently, the previously defined structure is transferred to the semiconductor, for example by dry-chemical etching. The etching depth is in this case selected so as to produce a stable preferred direction of the polarisation. The etching depth is for a long-wave InP-based VCSEL, for example, ~200 nm. The etching depth may be in particular between 0.1 and 2, preferably between 0.5 and 1, preferably approx. 0.5 period lengths. After removing the photoresist mask, the exposed structure is vapour-deposited with a dielectric material which merges directly with a Bragg mirror layer sequence, for example made of ZnS/CaF2 or a-Si/CaF2. In contradistinction to a conventional VCSEL without a grating, both a thickness of the semiconductive layer and a thickness of the first dielectric layer are to be modified in such a way that maximum polarisation stability is achieved. For this purpose, reflection within the Bragg mirror should be in-phase with reflection at the interface between the structure and the Bragg mirror.

Expediently, the second distributed Bragg reflector comprises a number of amorphous dielectric layers. This allows manufacture to be simplified. A further, closing layer, for example made of gold, can be applied in order to increase the reflectivity. The second distributed Bragg reflector is conventionally the backward mirror of the VCSEL. During manufacture, the output minor of the VCSEL is conventionally applied directly to the substrate in an epitaxial layer sequence.

According to a preferred configuration, the resonator includes a tunnel contact layer on the p side of the active zone. Buried tunnel junction (BTJ) VCSELs, in particular InP-based BTJ VCELs, display by far the best results for long-wave VCSELs in the wavelength range above 1.3 µm with regard to power, operating temperature, single-mode power and also modulation bandwidth, as the use of a BTJ allows, inter alia, a flow of current to be restricted to the actual region of an active zone. Expediently, a p confinement layer is arranged between the active zone and BTJ. Also expediently, an n confinement layer is arranged on a side (n side) of the active zone that is remote from the BTJ. These confinement layers are intended to form barriers to the charge carriers injected during operation in order to increase the duration of stay of the charge carriers in the active zone.

Expediently, a dimension, for example a length or a diameter, or an area of projection of the periodic structure onto the tunnel contact layer, corresponds at least to a dimension or an area of an aperture of the tunnel contact layer, respectively. Laser radiation is generated substantially in the area which is horizontally defined by the aperture of the tunnel contact layer. In order to obtain good polarisation stability, the periodic structure should extend at least over this area.

It is advantageous if the tunnel contact layer adjoins an n-doped semiconductor layer. This semiconductor layer can serve to power and contact the BTJ. At the same time, this semiconductor layer can adjoin or comprise the semiconductive material for the periodic structure, so that the semiconductor layer merges directly with the periodic structure. At this point, reference is made to the foregoing statements concerning adaptation of the thickness of the semiconductor layer.

According to the invention, a resonator comprising at least a first distributed Bragg reflector, an active zone having a p-n junction and a second distributed Bragg reflector is applied to a substrate. Furthermore, a periodic structure made of semiconductive material, on the one hand, and dielectric material, on the other hand, is applied within the resonator, the main plane of extension of which is arranged substantially perpendicularly to the direction of emission. The method according to the invention allows a laser diode according to the invention to be manufactured particularly reliably, reproducibly and with high quality.

In a preferred configuration, there are applied firstly the first distributed Bragg reflector which is embodied as an n-doped epitaxial Bragg mirror, then an n-doped confinement layer, then the active zone having a p-n junction, then a p-doped confinement layer and then a tunnel contact layer. Afterwards, the tunnel contact layer is structured in order to define an aperture. Subsequently, a semiconductor layer is applied that is structured in order to define the periodic structure. Subsequently, the second distributed Bragg reflector is applied. This preferred manufacturing method leads to high-quality laser diodes with good beam power and polarisation stability.

It will be understood that the features mentioned hereinbefore and those still to be explained hereinafter may be used not only in the respectively specified combination, but also in other combinations or in isolation, without departing from the scope of the present invention.

The invention is schematically illustrated based on an exemplary embodiment in the drawings and will be described in detail hereinafter with reference to the drawings.

Figure 2:
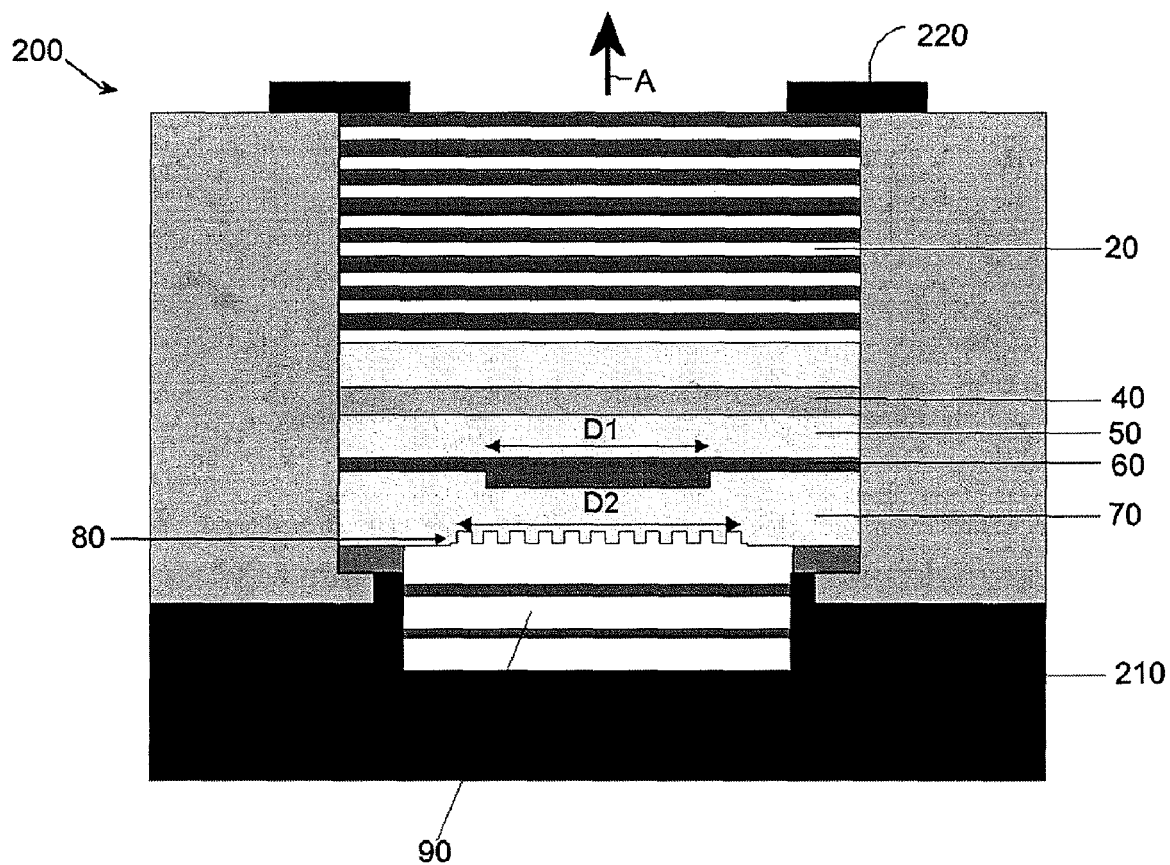
FIG. 2 shows schematically the layer construction of a second preferred embodiment of a laser diode, according to an embodiment.

FIGS. 1 and 2 will first be described hereinafter in a manner encompassing all of the figures, like elements being provided with like reference numerals.

FIGS. 1 and 2 are schematic sectional views of a first and a second preferred embodiment, respectively, of a laser diode according to the invention, which are denoted in their entirety by 100 and 200, respectively. Laser radiation emits, in both FIGS. 1 and 2, in the direction denoted by A.

Construction of a resonator, which is delimited by two Bragg mirrors 20 and 90, will, in particular, be explained in greater detail hereinafter.

Starting with an InP substrate 10, a first distributed Bragg reflector, which is embodied here as an n-doped epitaxial Bragg mirror 20, an n-doped confinement layer 30, an active zone 40 and a p-doped confinement layer 50 are successively applied in a first epitaxial growth process. The Bragg mirror 20 consists of an epitaxial DBR having a reflectivity of >99%. The structure is completed by growth of a tunnel contact layer 60, consisting for example of in each case a highly p+ and n+-doped InGaAs layer, located in a node (minimum) of the longitudinal field. Subsequent lithography and etching processes generate a freely dimensionable aperture D1 in layer 60, which either reaches up to layer 50 or ends within a p-doped part of layer 60. Typical etching depths are in this case 20 nm.

In a second epitaxy step, an upper n-doped current-supplying layer 70, consisting preferably of InP, and an optional n contact layer 75, consisting preferably of highly n-doped InGaAs, are applied. Subsequently, a periodic structure 80 is generated. For this purpose, a mask is defined on exposed semiconductor layer 70, for which purpose nanostructuring techniques such as electron beam lithography, nanoimprinting or holography are, for example, suitable. Subsequently, the above-defined structure is transferred to semiconductor layer 70, for example by dry-chemical etching. The etching depth is, for a long-wave InP-based VCSEL, for example ~200 nm. After removal of the photoresist mask, the exposed grating is subsequently vapour-deposited with a second distributed Bragg reflector which is made, for example, of ZnS/CaF2 or a-Si/CaF2 and is embodied here as a dielectric Bragg mirror 90. Periodic structure 80 is thus composed of parts of semiconductor layer 70 and parts of a first or adjoining dielectric layer 90a. A main plane of extension of structure 80 is arranged substantially perpendicularly to direction of emission A of semiconductor laser diode 100.

A second preferred embodiment 200 illustrated in FIG. 2 differs from laser diode 100 to the extent that the layer sequence is reversed. After applying second distributed Bragg reflector 90, second distributed Bragg reflector 90 is coated by a gold layer 210, resulting in reflectivity of almost 99.9%. Subsequently, the substrate (substrate 10 according to FIG. 1) is removed, for example by known etching techniques. A, for example annular, contact layer 220 is applied for contacting laser diode 200. D1 denotes a dimension (aperture) of tunnel contact layer 60, D2 a dimension of periodic structure 80.

The manufacture and form of a preferred configuration of periodic structure 80 will be explained in greater detail hereinafter with reference to FIGS. 3A through 3D, and FIG. 4. In this case, a process for manufacturing a periodic grating structure is schematically illustrated in FIGS. 3A through 3D. FIG. 4 is a perpendicular plan view onto the grating plane.

Figure 3A:
FIGS. 3A through 3D show a sequence of individual steps for manufacturing a periodic structure which is suitable for the invention.
Figure 3B:
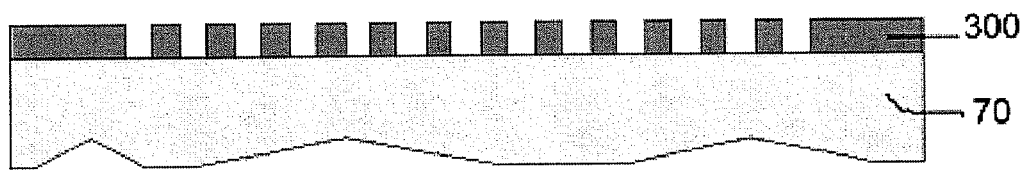
Figure 3C:
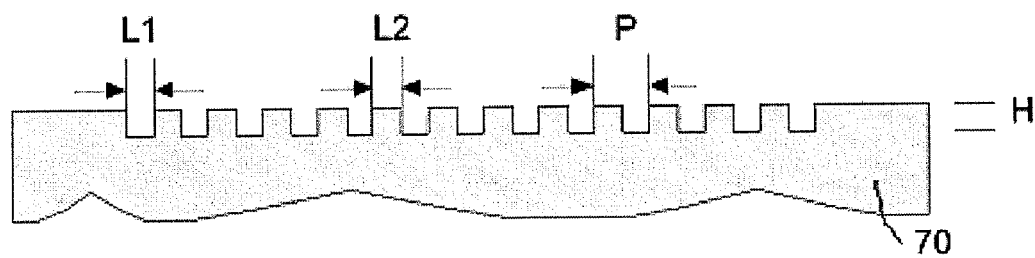
Figure 4:
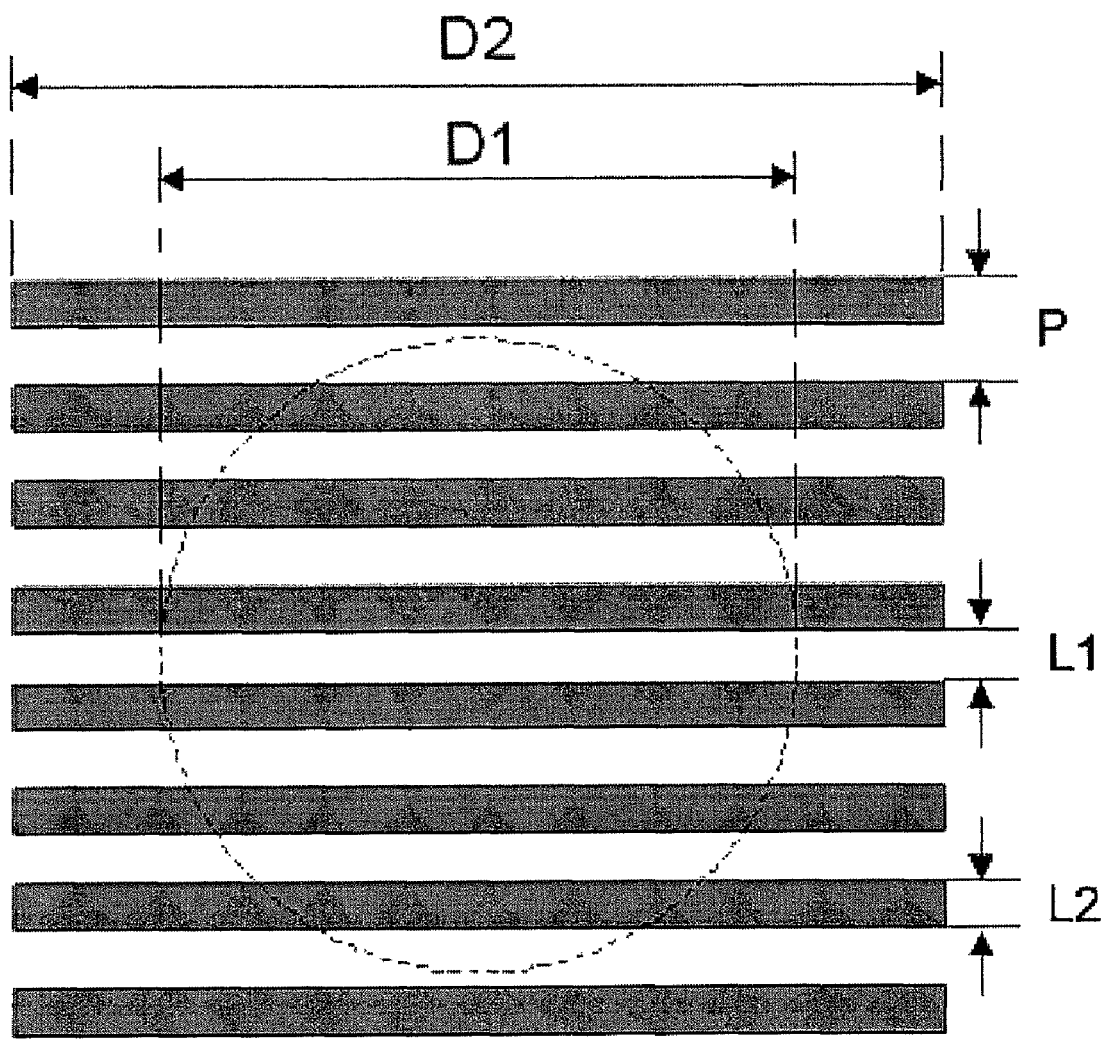
FIG. 4 is a schematic plan view of the periodic structure shown being built in FIGS. 3A through 3D.

FIG. 3A shows a semiconductor layer 70. FIG. 3B shows a photoresist layer 300 is first applied to the exposed semiconductor layer 70 and a structure to be generated is transferred to the photoresist layer. Known nanostructuring techniques such as electron beam lithography, nanoimprinting or holography are suitable for this purpose. After development of the photoresist, a predefined structure is obtained.

Subsequently, the predefined structure is transferred to semiconductor layer 70 by an etching method and the photoresist layer 300 is afterwards removed. In the example shown in FIG. 3C, a diffraction grating-like periodic structure having a period length P and a web/pit ratio of 1:1 is obtained, so that web widths L2 correspond to pit widths L1. An etching depth H is selected in such a way that a stable preferred direction of polarisation is obtained. In the present example, etching depth H corresponds to approx. 0.5 P.

In the illustrated example, period P of the structure is $\lambda/n$, $\lambda$ being the emission wavelength of the laser and n the higher of the two indices of refraction involved. At an emission wavelength of $\lambda=1{,}310$ nm and an InP index of refraction of n=3.2, this produces a period length of at most ~400 nm. Thus, web widths L2, pit widths L1 and also etching depth H are each approx. 200 nm.

Figure 3D:
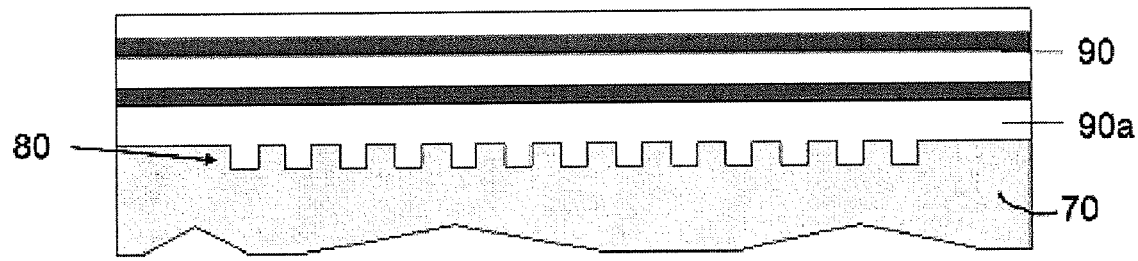

After the etching process, the photoresist mask 300 is removed and the exposed structure is covered with a dielectric layer 90a which is at the same time a first layer of a dielectric Bragg mirror 90 made, for example, of ZnS/CaF2 or a-Si/CaF2 and shown in FIG. 3D. The lateral extension D2 of structure 80 should correspond at least to extension D1 of buried tunnel contact 60 (see FIG. 1, FIG. 2).

It will be understood that the illustrated figures show only particularly preferred embodiments of the invention. In addition, any other embodiment, in particular as a result of a different arrangement or a different construction of the layers, etc., is conceivable without departing from the scope of this invention. The structure according to the invention can be applied to (BTJ) VCSELs in various material systems. These include, inter alia, GaAs, InP or GaSb-based components.

What is claimed is:

1. A vertical-cavity surface-emitting semiconductor laser diode having a resonator with a first distributed Bragg reflector, an active zone which has a p-n junction and is embedded into a sequence of semiconductor layers, and a second distributed Bragg reflector, the semiconductor laser diode having an emission wavelength $\lambda$, characterized by
    a periodic structure arranged within the resonator as an optical grating made of a semiconductive material and a dielectric material;
    a main plane of extension of the periodic structure being arranged substantially perpendicularly to a direction of emission of the semiconductor laser diode; and
    the periodic structure being in direct contact with at least one of the semiconductor layers and with at least one of the distributed Bragg reflectors, and wherein
    the periodic structure is made of at least one material of the semiconductor layers and at least one material of the two distributed Bragg reflectors,
    the period of the periodic structure is at most $\lambda/n$, n being a function of the index of refraction of the semiconductive material and/or the index of refraction of the dielectric material, and
    n is the higher of the two indices of refraction.

2. The semiconductor laser diode according to claim 1, wherein the period of the periodic structure is at most $\lambda/2n$.

3. The semiconductor laser diode according to claim 2, wherein the periodic structure is embodied as a subwavelength grating.

4. The semiconductor laser diode according to claim 1, wherein the periodic structure directly adjoins the second distributed Bragg reflector.

5. The semiconductor laser diode according to claim 4, wherein a material of the periodic structure is the same as a material of an adjoining layer of the second distributed Bragg reflector.

6. The semiconductor laser diode according to claim 5, wherein the second distributed Bragg reflector is an alternating layer system consisting of at least two materials having different indices of refraction.

7. The semiconductor laser diode according to claim 5, wherein a dielectric material of the periodic structure is the same as a material of an adjoining layer of the second distributed Bragg reflector.

8. The semiconductor laser diode according to claim 1, wherein the resonator further comprises a tunnel contact layer on a p side of the active zone.

9. The semiconductor laser diode according to claim 8, wherein a dimension of a projection of the periodic structure onto the tunnel contact layer corresponds at least to a dimension of an aperture of the tunnel contact layer.

10. The semiconductor laser diode according to claim 9, wherein the tunnel contact layer adjoins an n-doped semiconductor layer.

11. The semiconductor laser diode according to claim 8, wherein an area of a projection of the periodic structure onto the tunnel contact layer corresponds at least to an area of an aperture of the tunnel contact layer.

12. A vertical-cavity surface-emitting semiconductor laser diode having a resonator with a first distributed Bragg reflector, an active zone which has a p-n junction and is embedded into a sequence of semiconductor layers, and a second distributed Bragg reflector, the semiconductor laser diode having an emission wavelength $\lambda$, characterized by
    a periodic structure arranged within the resonator as an optical grating made of a semiconductive material and a dielectric material;
    a main plane of extension of the periodic structure being arranged substantially perpendicularly to a direction of emission of the semiconductor laser diode; and
    the periodic structure being in direct contact with at least one of the semiconductor layers and with at least one of the distributed Bragg reflectors, and wherein
    the resonator further comprises a tunnel contact layer on a p side of the active zone,
    a dimension of a projection of the periodic structure onto the tunnel contact layer corresponds at least to a dimension of an aperture of the tunnel contact layer,
    the tunnel contact layer adjoins an n-doped semiconductor layer, and
    the periodic structure directly adjoins the n-doped semiconductor layer.

13. The semiconductor laser diode according to claim 12, wherein the semiconductive material of the periodic structure is the same as a material of the n-doped semiconductor layer.

14. The semiconductor laser diode according to claim 12, wherein the periodic structure is made of at least one material of the semiconductor layers and at least one material of one of the two distributed Bragg reflectors.

15. The semiconductor laser diode according to claim 14, wherein a period of the periodic structure is less than or equal to $\lambda$.

16. The semiconductor laser diode according to claim 14, wherein a period of the periodic structure is less than or equal to $\lambda/2$.

17. The semiconductor laser diode according to claim 14, wherein the period of the periodic structure is at most $\lambda/n$, n being a function of the index of refraction of the semiconductive material and/or the index of refraction of the dielectric material.

18. The semiconductor laser diode according to claim 17, wherein n is the higher of the two indices of refraction.

19. The semiconductor laser diode according to claim 17, wherein the period of the periodic structure is at most $\lambda/2n$.

20. The semiconductor laser diode according to claim 19, wherein the periodic structure is embodied as a subwavelength grating.

21. The semiconductor laser diode according to claim 12, wherein the periodic structure directly adjoins the second distributed Bragg reflector.

22. The semiconductor laser diode according to claim 21, wherein a material of the periodic structure is the same as a material of an adjoining layer of the second distributed Bragg reflector.

23. The semiconductor laser diode according to claim 22, wherein the second distributed Bragg reflector is an alternating layer system consisting of at least two materials having different indices of refraction.

24. The semiconductor laser diode according to claim 22, wherein the dielectric material of the periodic structure is the same as a material of an adjoining layer of the second distributed Bragg reflector.

25. The semiconductor laser diode according to claim 12, wherein the semiconductive material of the periodic structure is the same as a material of the n-doped semiconductor layer.

* * * * *